United States Patent
Sweatt et al.

(10) Patent No.: US 6,210,865 B1
(45) Date of Patent: Apr. 3, 2001

(54) EXTREME-UV LITHOGRAPHY CONDENSER

(75) Inventors: William C. Sweatt, Albuquerque, NM (US); Donald W. Sweeney, San Ramon, CA (US); David Shafer, Fairfield, CT (US); James McGuire, Pasadena, CA (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/249,738

(22) Filed: Feb. 11, 1999

Related U.S. Application Data

(62) Division of application No. 09/130,224, filed on Aug. 6, 1998, now Pat. No. 6,118,577.

(51) Int. Cl.$^7$ ............... G03C 5/00; G02B 5/08; G02B 5/10; G02B 5/18; G21K 5/00
(52) U.S. Cl. ............. 430/311; 430/966; 359/351; 359/570; 359/572; 359/851; 359/856; 359/857; 359/858; 378/35
(58) Field of Search ............... 430/311, 966; 378/145, 85, 87, 34, 35; 359/856, 857, 858, 351, 570, 572, 851; 250/492.1

(56) References Cited

U.S. PATENT DOCUMENTS

| | | | |
|---|---|---|---|
| 4,798,446 | 1/1989 | Hettrick | 359/570 |
| 4,915,463 | 4/1990 | Barbee, Jr. | 359/360 |
| 5,138,490 | 8/1992 | Hohberg et al. | 359/570 |
| 5,315,629 | 5/1994 | Jewell et al. | 204/192.12 |
| 5,339,346 | 8/1994 | White | 378/34 |
| 5,631,721 | 5/1997 | Stanton et al. | 355/71 |
| 5,815,349 | 9/1998 | Nishi et al. | 355/71 |
| 5,848,119 | 12/1998 | Miyake et al. | 378/34 |
| 6,002,520 | 12/1999 | Hoch et al. | 359/565 |
| 6,033,079 | * 3/2000 | Hudyma | 359/857 |
| 6,118,577 | * 9/2000 | Sweatt et al. | 359/351 |

FOREIGN PATENT DOCUMENTS

| | | |
|---|---|---|
| 59-155920 | 9/1984 | (JP) . |
| 61-141135 | 6/1986 | (JP) . |
| 404120717 | 4/1992 | (JP) . |

OTHER PUBLICATIONS

Schmiedeskamp, B. et al., "Electron-beam-deposited Mo/Si and MoxSiy/Si multilayer x-ray mirrors and gratings", *Optical Engineering*, 33 (4) 1314–1321, 1994.

Fukuda, H. et al., "New optics design methodology using diffraction grating on spherical mirror for soft x-ray projection lithography", *J. Vac. Sci. Technol. B*, 13 (2), 366–370, 1995.

Patent Abstract of Japan, Publication No. 61141135, Ju. 28, 1986.

Patent Abstract of Japan, Publication No. 59155920, Sep. 5, 1984.

* cited by examiner

Primary Examiner—Shean C. Wu
(74) Attorney, Agent, or Firm—Burns, Doane, Swecker & Mathis, L.L.P.

(57) ABSTRACT

Condenser system for use with a ringfield camera in projection lithography where the condenser includes a series of segments of a parent aspheric mirror having one foci at a quasi-point source of radiation and the other foci at the radius of a ringfield have all but one or all of their beams translated and rotated by sets of mirrors such that all of the beams pass through the real entrance pupil of a ringfield camera about one of the beams and fall onto the ringfield radius as a coincident image as an arc of the ringfield. The condenser has a set of correcting mirrors with one of the correcting mirrors of each set, or a mirror that is common to said sets of mirrors, from which the radiation emanates, is a concave mirror that is positioned to shape a beam segment having a chord angle of about 25 to 85 degrees into a second beam segment having a chord angle of about 0 to 60 degrees.

12 Claims, 5 Drawing Sheets

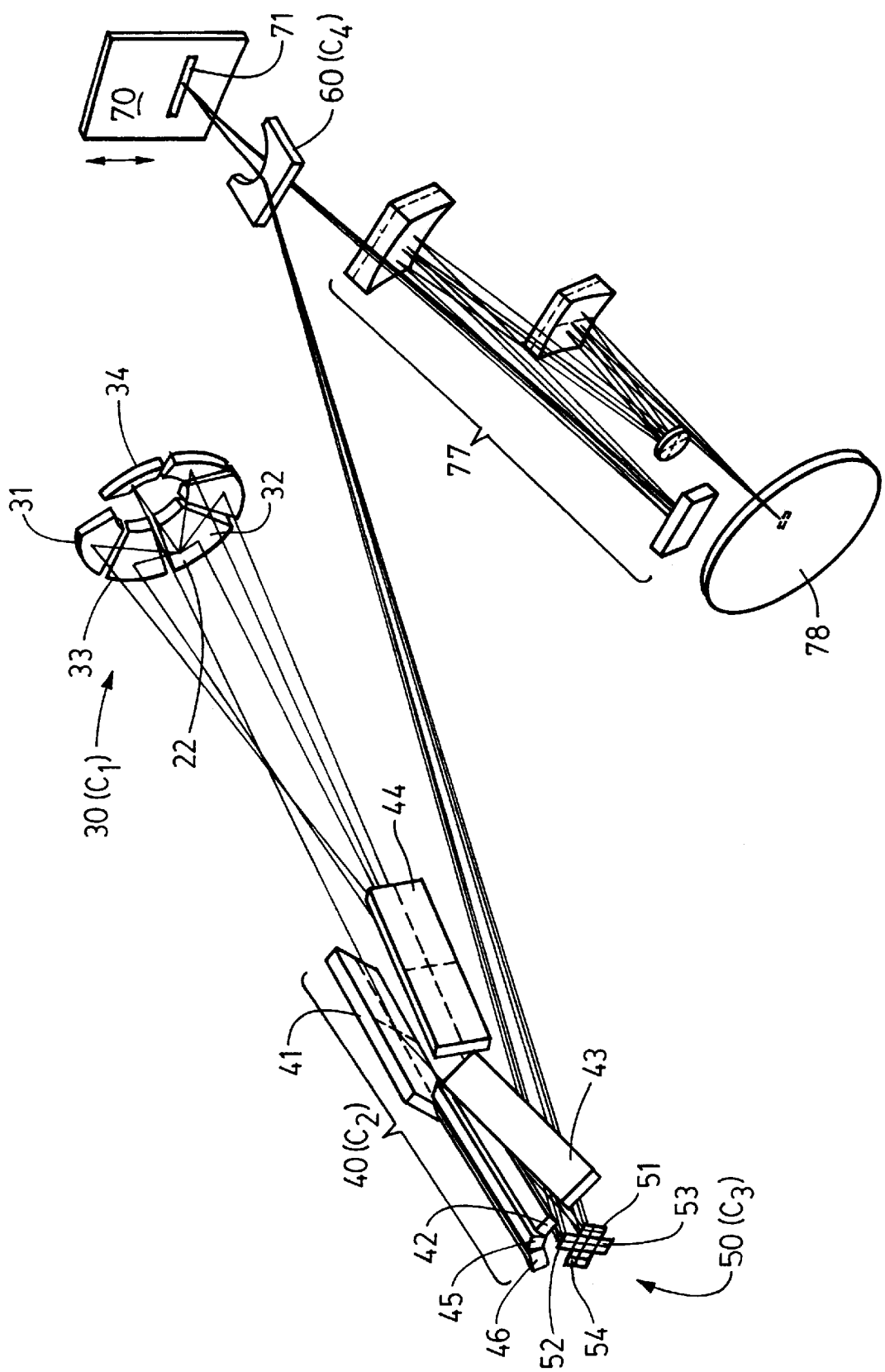
FIG._1A.

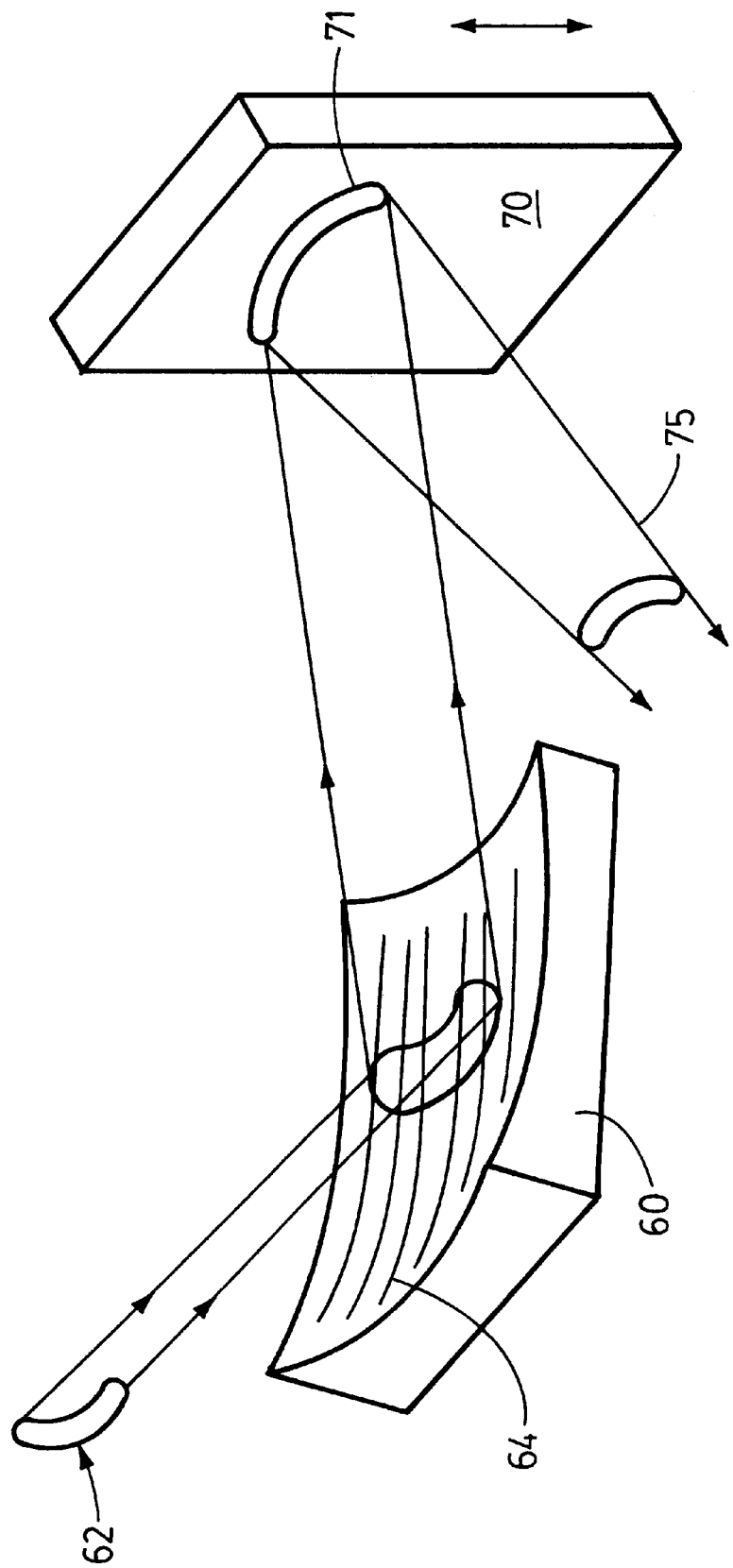
FIG. _1B.

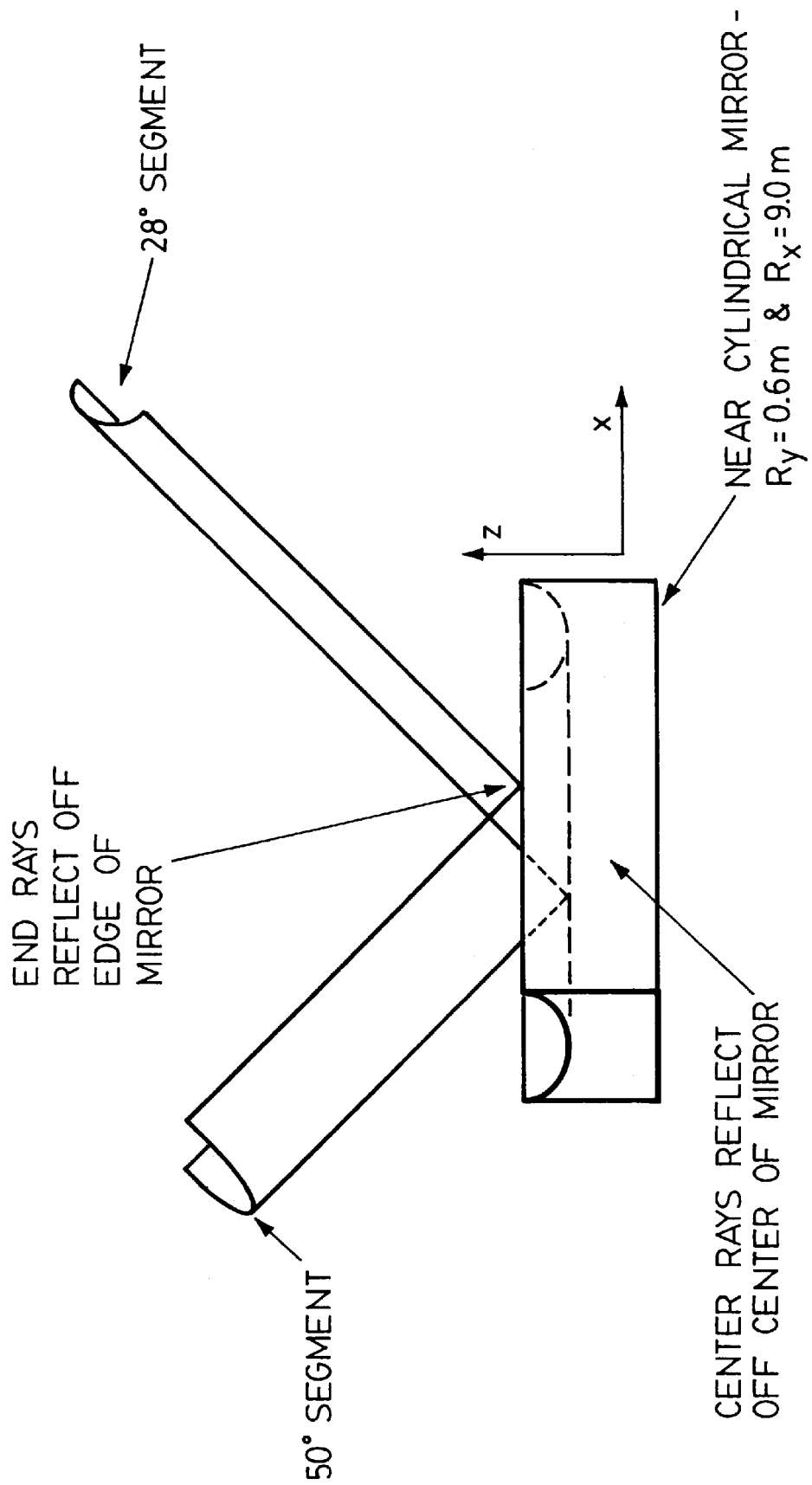
FIG._1C.

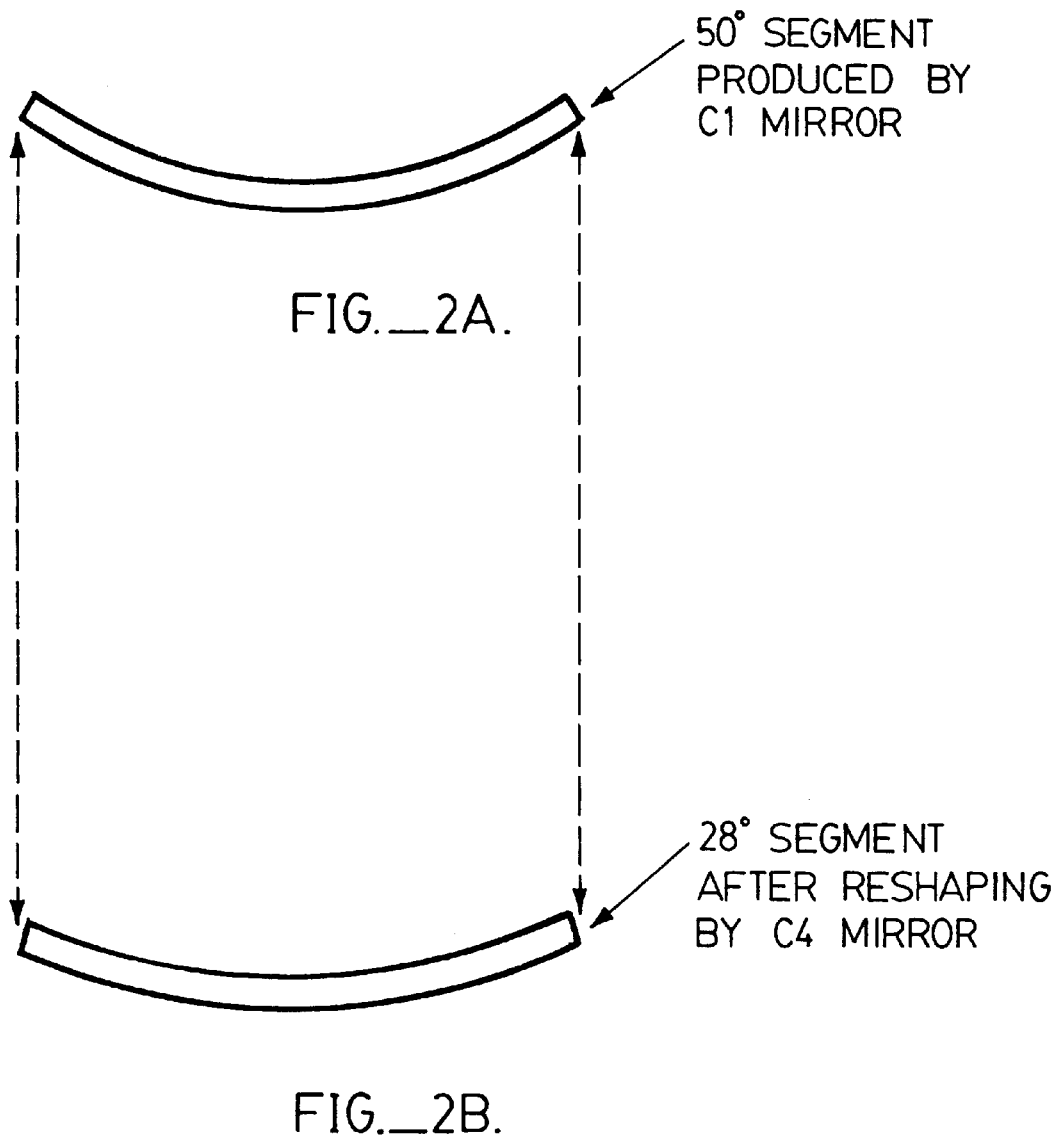

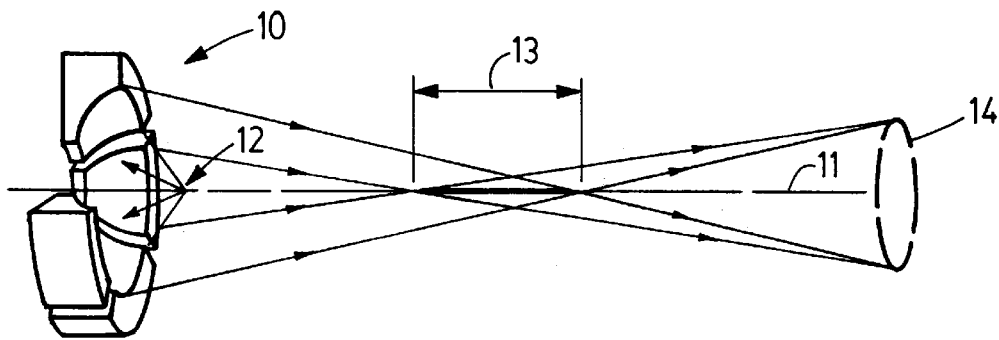
FIG._3.
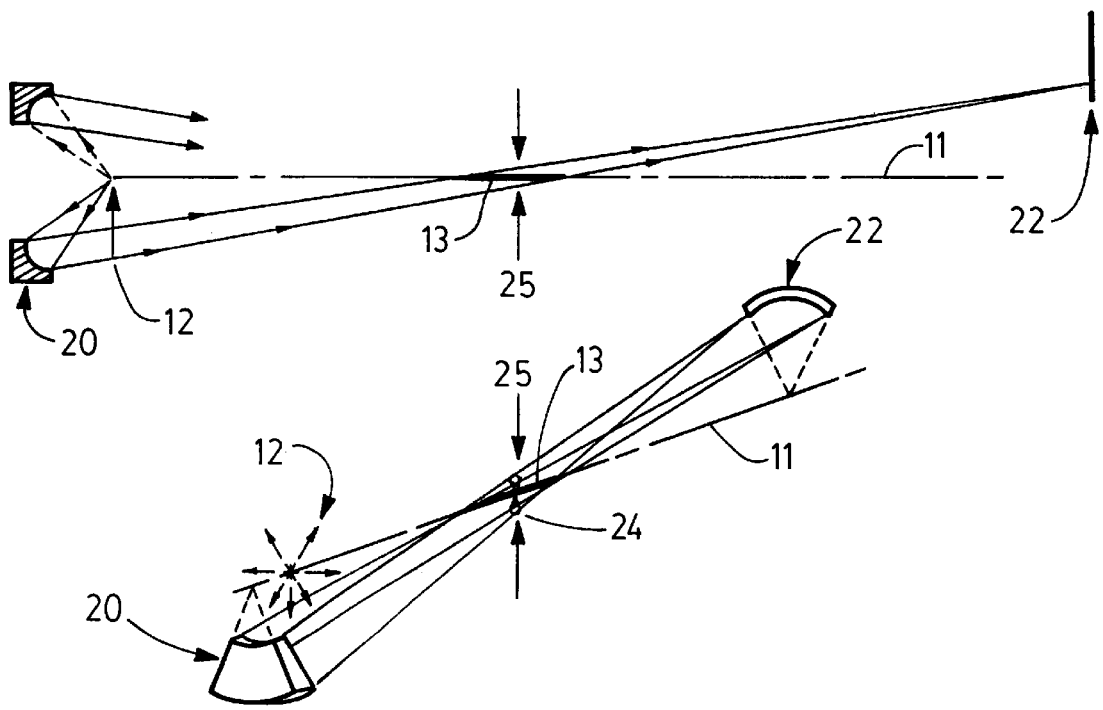
FIG._4.

EXTREME-UV LITHOGRAPHY CONDENSER

REFERENCE TO RELATED APPLICATION

This is a continuation-in-part application of Ser. No. 09/130,224 filed on Aug. 6, 1998, U.S. Pat. No. 6,118,577.

The U.S. Government has a paid-up license in this invention and the right in limited circumstances to require the patent owner to licence others on reasonable terms as provided for by the terms of Contract No. DE-AC04-94AL85000 awarded by the Department of Energy.

FIELD OF THE INVENTION

This invention relates to condensers that collect radiation and deliver it to a ringfield camera. More particularly, this condenser collects radiation, here soft x-rays, from either a small, incoherent source and couples it to the ringfield of a camera designed for projection lithography.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of λ=100 to 200 Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning (e.g., Jewell et al., U.S. Pat. No. 5,315,629 and Offner, U.S. Pat. No. 3,748,015), available condensers that can efficiently couple the light from a synchrotron source to the ringfield required by this type of camera have not been fully explored. Furthermore, fill field imaging, as opposed to ringfield imaging, requires severely aspheric mirrors in the camera. Such mirrors cannot be manufactured to the necessary tolerances with present technology for use at the required wavelengths. The present state-of-the-art for Very Large Scale Integration ("VLSI") involves chips with circuitry built to design rules of 0.25 μm. Effort directed to further miniaturization takes the initial form of more fully utilizing the resolution capability of presently-used ultraviolet ("UV") delineating radiation. "Deep UV" (wavelength range of λ=0.3 μm to 0.1 μm), with techniques such as phase masking, off-axis illumination, and step-and-repeat may permit design rules (minimum feature or space dimension) of 0.18 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Various x-ray radiation sources are under consideration. One source, the electron storage ring synchrotron, has been used for many years and is at an advanced stage of development. Synchrotrons are particularly promising sources of x-rays for lithography because they provide very stable and defined sources of x-rays, however, synchrotrons are massive and expensive to construct. They are cost effective only serving several steppers.

Another source is the plasma x-ray source, which depends upon a high power, pulsed laser (e.g., a yttrium aluminum garnet ("YAG") laser), or an excimer laser, delivering 500 to 1,000 watts of power to a 50 μm to 250 μm spot, thereby heating a source material to, for example, 250,000° C., to emit x-ray radiation from the resulting plasma. Plasma sources are compact, and may be dedicated to a single production line (so that malfunction does not close down the entire plant). A stepper employing a laser plasma source is relatively inexpensive and could be housed in existing facilities. It is expected that x-ray sources suitable for photolithography that provide bright, incoherent x-rays and that employ physics quite different from that of the laser plasma source will be developed.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem Necessary absence of optics in-between the mask and the wafer necessitates a high level of parallelism (or collimation) in the incident radiation. X-ray radiation of wavelength λ≦16 Å is required for 0.25 μm or smaller patterning to limit diffraction at feature edges on the mask.

Use has been made of the synchrotron source in proximity printing. Consistent with traditional, highly demanding, scientific usage, proximity printing has been based on the usual small collection arc. Relatively small power resulting from the 10 mrad to 20 mrad arc of collection, together with the high-aspect ratio of the synchrotron emission light, has led to use of a scanning high-aspect ratio illumination field (rather than the use of a full-field imaging field).

Projection lithography has natural advantages over proximity printing. One advantage is that the likelihood of mask damage is reduced because the mask does not have to be positioned within microns of the wafer as is the case for proximity printing. The cost of mask fabrication is considerably less because the features are larger. Imaging or camera optics in-between the mask and the wafer compensate for edge scattering and, so, permit use of longer wavelength radiation. Use of extreme ultra-violet radiation (a.k.a., soft x-rays) in bands at which multilayer coatings have been developed (i.e., λ=13.4 m, λ=11.4 nm) allows the use of near-normal reflective optics. This in turn has lead to the development of lithography camera designs that are nearly diffraction limited over useable image fields. The resulting system is known as extreme UV("EUVL") lithography (a.k.a., soft x-ray projection lithography ("SXPL")).

A favored form of EUVL projection optics is the ringfield camera. All ringfield optical forms are based on radial dependence of aberration and use the technique of balancing low order aberrations, i.e., third order aberrations, with higher order aberrations to create long, narrow arcuate fields of aberration correction located at a fixed radius as measured from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width defines a region in which features to be printed are sharply imaged. Outside this region, increasing residual astigmatism, distortion, and Petzval curvature at radii greater or smaller than the design radius reduce the image quality to an unacceptable level. Use of such an arcuate field allows minimization of radially-dependent image aberrations in the image and use of object:image size reduction of, for example, 4:1 reduction, results in significant cost reduction of the, now, enlarged-feature mask.

Sweatt, U.S. Pat. No. 5,361,292, discloses a condenser that includes a series of aspheric mirrors on one side of a small, incoherent source of radiation. If the mirrors were continuously joined into a parent mirror, they would image the quasi point source into a ring image with a diameter of a few tens of centimeters at some distance, here some number of meters. Since only a relatively small arc (about 60 degrees) of the ring image is needed by the camera, the most efficient solution is to have about five 60 degrees beams, all of which are manipulated such that they all fall onto the same arc needed by the camera. Also, all of the beams must be aimed through the camera's virtual entrance pupil. These requirements are met in two steps.

First, the beams are individually rotated and translated, as necessary, using mirrors so that they overlap at the ringfield and pass through the real entrance pupil. The second step is to image this real entrance pupil into the camera's virtual entrance pupil using a powered imaging mirror. This places the corrected, combined images of the mirrors into the proper position for use by the camera. This system may be configured in a variety of ways.

The earliest ringfield EUVL cameras as exemplified by Jewell et al., U.S. Pat. No. 5,315,629, that are designed for printing large (25 mm×25 mm) chips had instantaneous fields of view with an average radius of 25 mm and a chord length of 25 mm. When this type of ringfield camera is employed with the condenser of U.S. Pat. No. 5,361,292 the angle of the chord is 60 degrees which fit the 5 off-axis segments of the aspheric mirror, each 60 degrees wide, that comprise the illuminator or collecting mirrors of the condenser. However, with improved camera designs that have roughly the same chord length but with a much larger, e.g., 52 mm, average radius of the ringfield, the angle of the chord is about 28 degrees, into which the six ring images created by the illuminator mirrors are fitted. Six times the 28 degrees is significantly less half of the 360 degrees available so that a condenser using the design presented in U.S. Pat. No. 5,361,292 would be fairly inefficient.

SUMMARY OF THE INVENTION

The present invention is directed to a condenser that includes a series of aspheric mirrors on one side of a small, incoherent source of radiation producing a series of beams. Each aspheric mirror images the quasi point source into a curved line segment. A relatively small arc of the ring image is needed by the camera; all of the beams are so manipulated that they all fall onto this same arc needed by the camera. Also, all of the beams are aimed through the camera's virtual entrance pupil. The invention is based in part on the recognition that improvement in overall system efficiency is achieved by including a correcting mirror for reshaping a beam segment. The improved condenser efficiently fills the larger radius ringfield created by today's advanced camera designs.

Accordingly, in one aspect, the invention is directed to a condenser system for use with a ringfield camera that includes:

a small compact source of radiation;

collector mirrors including at least two substantially equal radial segments of a parent aspheric mirror, each having one focus at the radiation source and a curved line (e.g. arc) focus filling the object field of the camera at the radius of the ringfield and each producing a beam of radiation; and a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a relay mirror including a concave mirror that is positioned to shape a beam segment having a chord angle of about 25 to 85 degrees into a second beam segment having a chord angle as large as about 60 degrees or as little as zero degree which would be represented by a long, thin rectangle.

In a preferred embodiment, the concave mirror comprises six substantially equal radial segments of a parent aspheric mirror. In another preferred embodiment, the concave mirror shapes a beam having a chord angle of about 25 to 85 degrees and preferably at about 50 degrees into a second beam having a chord angle of about 0 to 60 degrees and preferably at about 28 degrees.

In another aspect, the invention is directed to a process for fabricating integrated devices that includes at least one element having a dimension ≦0.25 μm and preferably ≦0.18 μm by projection lithography that employs the inventive condenser system.

BRIEF DESCRIPTION OF THE DRAWINGS

FIG. 1A is a perspective view of an EUV photolithography system showing the beams going through its set of correcting mirrors and showing the interaction of the beam with the camera;

FIGS. 1B and 1C illustrate a steeply tilted biconvex mirror;

FIGS. 2A and 2B illustrate a beam segment before and after reshaping;

FIG. 3 is a side-view of the condenser system without correcting mirrors, showing the reimaging of the point source into a ringfield with the images crossing over the center line of the system; and FIG. 4 is another side-view showing the geometries of the mirrors and the beams in more detail for this embodiment.

DETAILED DESCRIPTION OF THE INVENTION

The following terms of art are defined before providing a description and discussion of the present invention.

A. Terms of Art

Synchrotron Source: X-ray radiation source constructed from a storage ring providing for relativistic electrons or positrons confined by magnetic fields to a repeating orbital path.

A small, compact source of radiation: A volume that radiates extreme-UV radiation. An example of such a source is a laser-generated plasma. "Small" implies a radiating volume with dimensions in the three principle directions smaller than about 0.2 mm. "Compact" implies that the three dimensions are roughly the same, differing from one-another by less than a factor of two. These lengths are defined as the full width between the half-maximum intensity points.

Illuminating Radiation: A collection of photons, each of which has energy capable of exposing photoresist incident on and producing an illumination field on a mask. The illumination field is characterized by its intensity, direction, divergence, and spectral width.

EUV: Extreme Ultra-Violet Radiation, also known as soft x-rays, with wavelength in the range of 50 to 700 Å.

Ringfield Camera: While the inventive condenser is not limited to use with any particular ringfield camera, a preferred one is described in Sweeney et al., "EUV Optical Design for a 100 nm CD Imaging System" SPIE Vol. 3331, pages 2–10, 1998, which is incorporated herein by reference.

Spherical Mirror: A mirror, either concave or convex, whose surface forms part of a sphere. Although the present invention employs the use of spherical mirrors for convenience and economical concerns, it is intended that other mirrors be covered by the present invention, such as toroidal and conic section (e.g., parabolic, hyperbolic, general aspheric, elliptical, cylindrical, etc.), mirrors that may be substituted for spherical mirrors within tolerable industry standards (including those with minor flaws or aberrations), etc.

Flat Mirror: A mirror whose surface is nearly flat within manufacturing tolerances. Although the present invention employs the use of flat mirrors, it is intended that the present invention be easily modified by those of ordinary skill in the art to employ the use of other shaped mirrors where flat mirrors are disclosed in the following discussion.

Divergence: As used by itself, the term refers to a cone of rays diverging from an image point.

Convergence: As used by itself, the term refers to a cone of fight converging toward an image point, a.k.a. focusing.

Condenser: Optical system for collecting the source radiation, for processing the source radiation to produce a ringfield illumination field and for illuminating the mask.

Collecting Optics (or Collector): The optics within the condenser responsible for collecting the source radiation. The collector has a focus.

Processing Optics: The optics within the condenser that is responsible for orienting and positioning the collected beams, and modifying their convergence.

Binary Optical Element (BOE): A diffracting structure fabricated by lithographic processes. These are typically "phase-only", which means that the grating only affects the phase of the incident light, not the intensity. BOEs typically have 2, 4, 8, or 16 levels requiring 1, 2, 3, or 4 masks or write cycles, respectively.

Imaging Optics (or Camera Optics): The optics following the condenser and mask, in addition to the collecting and processing optics, responsible for delivering mask-modulated radiation to the wafer, i.e., the camera optics.

Camera Pupil: Real or virtual aperture that defines an opening through which source radiation from any object point must enter the camera. Its physical size is that of an image of the real limiting aperture of the camera.

Aperture Stop: The point at which the principal rays cross; the stop serves to limit the size of the cone angles of the ray bundles converging toward the image from any point in the object field.

Lens: The term is used in this description to define any optical element which causes radiation to converge or diverge. "Lenses," in soft x-ray or EUV systems, are generally reflecting and are sometimes referred to as "mirrors." Contemplated lenses may be multi-faceted or may be non-faceted, i.e., continuous, e.g., of ellipsoidal or other curvature. The convergence or divergence is a result of action analogous to that of a transmission optical lens.

Full-field Exposure: Simultaneous (rather than sequential) exposure of all subareas of an image field. In its derivation, the term refers generally to a complete circuit pattern such as that of an entire chip. In this description, it is used to refer to any low-aspect ratio rectilinear pattern region, whether of an entire or partial pattern. Contemplated partial patterns may be stitched together by step-and-repeat to constitute the entire pattern.

Diffraction Grating: Diffraction is a scattering phenomenon resulting from the wave nature of light and some perturbation in the field of propagation. A diffraction grating is typically an ordered roughness on a mirror face. The scattering produced by the roughness can be controlled by ordering the roughness. For example, if the roughness is produced by a set of parallel lines, (ridges, grooves, or other structures with a two-dimensional cross section), then the diffraction or scattering will be perpendicular to the lines, and if the lines are all identical and equally spaced, the radiation will be diffracted only in a few discrete angles. This is commonly known as a linear diffraction grating. Diffraction grating are further described in Sweatt et al., "Diffractive Element in Extreme-UV Lithography Condenser", U.S. patent application Ser. No. 09/130,224, filed Aug. 6, 1998, which is incorporated herein by reference.

B. The Invention

The overall layout of the EUV lithography system is shown in FIG. 1A. The radiation is collected from the source 22 by mirror segments 30 (referred to collectively as the "$C_1$" mirrors) which create arc images that are in turn are rotated by roof mirror pairs illustrated collectively as mirrors 40 and 50 (referred herein as the "$C_2$" and "$C_3$" mirrors, respectively). Beams of radiation reflected from mirrors 50 are reflected by a toric mirror 60 (or $C_4$ mirror) to deliver six overlapped ringfield segments onto reflective mask 70. At least two segments of the parent mirror 30 are employed. Typically, the parent mirror is partitioned into 2 to 12 segments, preferably into 5 to 8 segments, and most preferably into 6 segments as shown. As an example, mirror 31 creates an arc image and roof mirror pair 41 and 51 rotates the arc image to fit the slit image and translate it to the proper position. Similar arc images are created and processed by mirror combinations 32, 42, and 52, and so on. Mirrors 41, 42, and 43 are parts of different and unique channels; and the group of mirrors 44, 45, and 46 is a mirror image of the group of mirrors 41, 42, and 43, respectively.

The distance from the $C_3$ mirrors defining the condenser's pupil to the $C_4$ mirror should be 3 to 10 times as long as the distance from the $C_4$ mirror to mask 70. An illustrative arc 71 is shown on mask 70.

The EUV lithography system further includes a ringfield camera 77 having a set of mirrors which images the mask using the radiation onto wafer 78. As is apparent, the $C_4$ mirror follows the real entrance pupil.

Each of the six pairs of $C_2$ and $C_3$ mirrors act as a roof-mirror pair that rotate and translate the 6 channels so that they overlap. Specifically, the $C_2$ and $C_3$ mirror pairs rotate the arcuate images produced by the $C_1$ mirrors so that they can be superimposed at the mask plane. The $C_2$ mirrors are preferably flat and are used at grazing incidence, which is preferably 82 degrees angle of incidence for the chief ray. The chief ray angle of incidence is preferably constrained to have the same angle of incidence at each $C_2$ mirror so that the reflectivities will be the same. Further, the $C_1$ angles are preferably tilted about the source to allow the angles of incidence to be the same at $C_1$. The $C_3$ mirrors typically have weak convex spherical surfaces which relay the $C_1$ arcuate images onto the mask. The $C_3$ mirrors are located at the system pupil (i.e., where the azimuthal beam cross-section is a minimum) to facilitate packaging and are tilted to overlay the arcuate images from the six channels. The $C_3$ mirrors are preferably positioned as close together as possible (approximately 3 mm separates the clear apertures) to maximize the amount of EUV that can be directed into the camera.

FIGS. 1B and 1C depict the $C_4$ field mirror 60 which is toroidally (or elliptically) shaped. As shown, a beam cross section 62 from the condenser is reflected from the surface of the mirror 60 to form a curved slit illumination 71 on moving mask 70. Beam 75 is propagated from the mask into the camera. The toroid images the real pupil containing the $C_3$ mirrors into the entrance pupil of the camera. The focal length of mirror $C_4$ can be determined from the lens maker's equation. The radii of curvature $R_x$ and $R_y$ are functions of the focal length and the angle of incidence θ, as determined by Coddington's equation. The tilt angle also tends to distort the cross-section of an incident beam, with the distortion increasing with angle of incidence. The source of this distortion is shown in FIG. 1C. Specifically, FIG. 1C illustrates an embodiment of the $C_4$ biconcave mirror where $R_y$ is 0.6 m and $R_x$ is 9.0 m. As is apparent, remapping occurs when the middle of the 50 degrees segment is reflected off the bottom of the nearly cylindrical, steeply tilted concave mirror while the ends reflect off the edges of the mirror which are higher.

FIGS. 2a and 2b shows a beam segment before and after reshaping. Note that the ends of the 50 degrees segment curl far more than those of the 28 degrees segment.

Condensers of the present invention are particularly suited for use in projection lithography for fabricating integrated devices that comprise at least one element having a dimension of $\leq 0.25$ μm and preferably $\leq 0.18$ μm. The process comprises construction of a plurality of successive levels by lithographic delineation using a mask pattern that is illuminated to produce a corresponding pattern image on the device being fabricated, ultimately to result in removal of or addition of material in the pattern image regions. Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

As shown in FIG. 3, the illuminator or collecting mirrors are composed of six off-axis segments of an aspheric mirror, each 50 degrees wide, producing six beams which each cross over the system axis or centerline 11 as defined by the source and the center of the parent mirror. The parent aspheric mirror 10 images the "point" source 12 into a ring image 14. Therefore, its cross-section in the r-z plane is elliptical with one of the foci at the plasma source and the other at the ringfield radius. Each of the 50 degree mirror segments images the source into a 50 degree segment of the ring image.

FIG. 4 shows both a meridian cross-sectional view and an isometric view of the beam from one segment 20 of the aspheric mirror, with the isometric view rotated relative to the side view about a line 25 passing through the area of the beam having a smallest beam cross section. It shows the shape of the collector mirror 20, the arc image 22, and the bow-tie-shaped minimum beam cross-section 24, which is located at the center of the axial line focus. This design gives uniform illumination along the length of the arc 22.

The maximum possible system efficiency is a function of the size of the source, the camera parameters, and the reflectivity of the mirror, and, of course, the basic design of the of the condenser. The collection efficiency depends on the Entendu of the whole optical system. The Entendu or Lagrange invariant derived from the theorm of conservation of energy and indicates that, for an unvignetted pencil of light, the product of image height and numerical aperture is the same at all image planes in the system. This leads to an equivalence between source parameters (volume and collection angle) and camera parameters (ringfield width and numerical aperture). If one were to illuminate the ring field with only one beam, one could use the entire numerical aperture for it. However, with six beams one can only use about one sixth of the entrance pupil area for each beam. Thus, the camera parameters together with the 150 μm source size limit the beam collection angle to about 40 degrees in elevation (and by 6×50 degrees=300 degrees in azimuth). This results in a total collection efficiency of about 40% of the radiation into the hemisphere.

The transmission efficiency of the beam lines depends on the reflectivity of the mirrors. At 14 nm, the theoretically perfect reflectivities are about 55%, 90%, 65% and 90%, where the first number is the average reflectivity of the aspheric collector ($C_1$), the next is for the grazing-incidence flats ($C_2$), the next for the mirror at the real entrance pupil ($C_3$), and the last is for the reimaging concave mirror ($C_4$) (e.g., toroid or sphere). The product of these ideal reflectivities is about 30%, which means that theoretically, 12% of the soft x-rays from the source can be delivered to the mask. With real reflectivities, one can expect more on the order of 11% of the EUV radiated into a hemisphere to be delivered.

Each segment of the $C_1$ mirror is astigmatic, having different circumferential and tangential focal planes. The circumferential image is the on-axis line focus 13 shown in FIG. 4. This line is centered in the real entrance pupil, essentially giving Kohler illumination along the ring field. The tangential image 22 (in the r-z plane) is located at the ring field, giving critical illumination. In a normal, non-scanning system this would give intensity and image quality variations in the radial direction. However, the scanning integrates out these radial variations. Hence, one is left with the uniform image quality which can only be achieved with two-dimensional Kohler illumination in a non-scanned system.

Partial coherence in the illumination affects the image quality. In an incoherently illuminated optical system, small features are attenuated due to the fall-off of the modulation transfer function (MTF). Partial conherence can be introduced into the illumination to counter this attenuation. This normally done by underfilling the entrance pupil in a system with Kohler illumination. Put a different way, the source (which is usually a disk) is imaged into the entrance pupil and this image is smaller than the pupil by a factor of $\sigma \approx 0.6$. This value of $\sigma$ is a reasonable compromise which amplifies the small features and does not add too much "ringing" to the larger features.

Another preferred system employs a laser plasma source that emits soft x-rays where the diameter and height of the source is about 150 $\mu$m. The camera at the other end of the system images a 28 degree, 100 mm long by 4 mm wide ringfield onto the wafer at 4× reduction. The entrance pupil is 3 m behind the reflective object mask, and the numerical aperture of the camera is n.a.=0.10 at the wafer and 0.025 at the mask.

The $C_4$ mirror images the real entrance pupil (the $C_3$ plane) into the camera's entrance pupil. The size of this image should not vary significantly from that chosen to give the correct partial coherence (i.e. $\sigma$=0.7). Because the fuzziness of the image is relatively unimportant, a simple toroid can be used to reimage the pupil.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A condenser system for use with a ringfield camera to collect and image radiation to a mask comprising:
   a small compact source of radiation;
   collector mirrors comprising at least two substantially equal radial segments of a parent aspheric mirror, each having one focus at the radiation source and a curved line focus filling the object field of the camera at the radius of the ringfield and each producing a beam of radiation; and
   a corresponding number of sets of correcting mirror means which are capable of translation or rotation, or both, such that all of the beams of radiation pass through the entrance pupil of the camera and form a coincident arc image at the ringfield radius, wherein at least one of the correcting mirrors of each set, or a mirror that is common to said sets of mirrors, from which the radiation emanates, is a concave relay mirror that is positioned to shape a beam segment having a chord angle of about 25 to 85 degrees into a second beam segment having a chord angle of about 0 to 60 degrees, wherein the distance from the collector mirrors to the concave relay mirror is equal to 3 to 10 times the distance from the concave relay mirror to the mask.

2. The condenser system of claim 1 wherein the said collector mirrors comprise six substantially equal radial segments of a parent aspheric mirror.

3. The condenser system of claim 1 wherein said concave relay mirror shapes a beam having a chord angle of about 50 degrees into a second beam having a chord angle of about 28 degrees.

4. The condenser system of claim 3 wherein the concave relay mirror reflects radiation from the source of radiation at an angle of incidence greater than 50 degrees as measured from normal at the center of the concave relay mirror.

5. A process for fabrication of a device comprising at least one element having a dimension $\leq 0.25$ $\mu$m, such process comprising construction of a plurality of successive levels, construction of each level comprising lithographic delineation, in accordance with which a subject mask pattern on a mask is illuminated to produce a corresponding pattern image on the device being fabricated, ultimately to result in removal of or addition of material in the pattern image regions, in which illumination used in fabrication of at least one level is extreme ultra-violet radiation, characterized in that the process employs a condenser system having a set of collector mirrors for collecting extreme ultraviolet radiation from a radiation source, and having correcting mirrors which are capable of translating or rotating, or both, one or more beams from said set of mirrors, wherein at least one of the correcting mirrors, or a mirror that is common to all sets, from which the radiation emanates, is a concave relay mirror that is positioned to shape a beam segment having a chord angle of about 25 to 85 degrees into a second beam segment having a chord angle of about 0 to 60 degrees, where the distance from the collector mirrors to the concave relay mirror is equal to 3 to 10 times the distance from the concave relay mirror to the mask.

6. The process of claim 5 wherein the collector mirrors comprise six substantially equal radial segments of a parent aspheric mirror.

7. The process of claim 5 wherein said concave relay mirror shapes a beam having a chord angle of about 50 degrees into a second beam having a chord angle of about 28 degrees.

8. The process of claim 5 wherein the device fabricated has at least one element having a dimension of $\leq 0.18$ $\mu$m.

9. The process of claim 5 wherein the radiation sources is a small compact source.

10. The process of claim 5 in which lithographic delineation is by projection, and in which collected radiation is processed to accommodate imaging optics of a projection camera.

11. The process of claim 10 in which projection comprises ringfield scanning comprising illumination of a straight or arcuate region of a projection mask.

12. The process of claim 10 in which projection comprises reduction ringfield scanning in accordance with which an imaged arcuate region on the image plane is of reduced size relative to that of the subject arcuate region so that the imaged pattern is reduced in size relative to the mask region.

* * * * *